(12) United States Patent
Ludwig

(10) Patent No.: US 7,157,707 B2
(45) Date of Patent: Jan. 2, 2007

(54) RADIATION DETECTOR, SENSOR MODULE HAVING A RADIATION DETECTOR, AND METHOD FOR MANUFACTURING A RADIATION DETECTOR

(75) Inventor: Ronny Ludwig, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 151 days.

(21) Appl. No.: 11/031,480

(22) Filed: Jan. 7, 2005

(65) Prior Publication Data

US 2005/0156109 A1 Jul. 21, 2005

(30) Foreign Application Priority Data

Jan. 15, 2004 (DE) .................. 10 2004 002 164

(51) Int. Cl.
*G01J 5/00* (2006.01)
*H01L 35/28* (2006.01)
(52) U.S. Cl. ................................. 250/338.1; 136/224
(58) Field of Classification Search ............. 250/338.1; 136/224
See application file for complete search history.

(56) References Cited

U.S. PATENT DOCUMENTS 5,962,854 A * 10/1999 Endo .................. 250/349
2004/0187904 A1 * 9/2004 Krellner et al. ........... 136/213

\* cited by examiner

*Primary Examiner*—David Porta
*Assistant Examiner*—Mindy Vu
(74) *Attorney, Agent, or Firm*—Kenyon & Kenyon LLP

(57) ABSTRACT

A radiation detector, a method for manufacturing a radiation detector, and a sensor module having a radiation detector. The radiation detector may include a thermopile chip having a diaphragm, a first cavity formed underneath the diaphragm, a thermopile structure formed on the diaphragm and an absorber layer applied to the thermopile structure, a cover chip, which has a second cavity on its bottom and is attached to the thermopile chip in such a way that the diaphragm having the thermopile structure and the absorber layer is located between the first cavity and the second cavity and, a filter plate attached to the cover chip via an adhesive layer of a defined layer thickness for transmitting infrared radiation of a defined wavelength range. Spacer means, for example, spacers may be provided for the defined layer thickness.

17 Claims, 2 Drawing Sheets

RADIATION DETECTOR, SENSOR MODULE HAVING A RADIATION DETECTOR, AND METHOD FOR MANUFACTURING A RADIATION DETECTOR

FIELD OF THE INVENTION

The present invention relates to a radiation detector for measuring infrared radiation, a sensor module having a radiation detector of this type, and a method for manufacturing a radiation detector.

BACKGROUND INFORMATION

To measure a concentration of an individual gas, the absorption of infrared radiation (IR radiation) of a certain wavelength range by the gas molecules of the individual gas in question over a measuring distance may be measured. For this purpose, an IR radiation source and a radiation detector, which is located opposite the IR radiation source over the measuring distance and may be accommodated in a sensor module, are used. In general, the radiation detector has plate-shaped filter elements which are applied over a thermopile structure having an absorber layer. The filter elements here determine the wavelength range and thus the individual gas to be measured. The infrared radiation passing through the radiation filter of the filter element strikes the absorber layer, where it is converted into heat which may be measured by the thermopile structure as a thermal e.m.f. The thermopile structure is usually applied to a diaphragm of a sensor chip and may be read by the sensor module via a contact. Sensor modules are known which have a metallic housing on whose bottom the thermopile chip is located, the filter plates being glued to the inside of the metallic cover of the metallic housing via openings.

Such a structure is, however, very complicated and expensive. Furthermore, the thermopile chip is not encapsulated, which makes the separation of the chip from the wafer using a sawing process and the assembly and handling of the chips very complicated and expensive. Furthermore, assembling the filter plates by gluing via openings made in the metallic cover is very complicated. To achieve proper adhesion, a filter plate is employed that is relatively large in relation to the optical range used, which is in turn expensive to manufacture due to its size. Furthermore, a considerable size of the filter plates is also necessary to even out adjustment tolerances between the base of the metallic housing having the thermopile chips and the metallic cover having the filters.

Due to the adhesive attachment of the filter chips to the metallic housing, the filter chips are no longer hermetically sealed at the adhesion points due to the welding of the hermetically sealed housing, so that for applications relevant with regard to safety in the automobile industry the wire contacts between the thermopile and housing contacts must be passivated. Passivation of the wire connections, which are used for contacting, between the thermopile chip located in the housing and the electrical contacts in the housing to protect them against external influences is generally not possible, because the passivating agent, usually a gel, would get into the path of the infrared radiation leading to the thermopile chip through the metallic cover having the radiation filter.

The radiation detector according to the present invention, the sensor module according to the present invention, and the method according to the present invention for manufacturing a radiation detector have the advantage over the related art that they make a more stable and reliable construction possible which has a relatively low complexity and low manufacturing cost, while meeting the requirements for use in the automobile industry.

In accordance with an example embodiment of the present invention, a thermopile chip manufactured using surface micromechanics having a cover chip is sealed hermetically, i.e., vacuum-tight, and a filter plate is glued directly onto this cover using an adhesive that is highly transparent in the relevant infrared wavelength range. An adhesive layer of a defined layer thickness is formed.

An additional chip having a filter structure formed on its top and/or bottom may be used in particular as a filter plate. The defined layer thickness may advantageously be achieved using spacer means, which may be, for example, spacers embedded in the adhesive layer, e.g., glass beads, glass rods, or defined granulates or crystallites or a structure of spacers formed on the top of the cover chip which do not affect the radiation path through the filter plate and the cover chip.

The chips are preferably made of silicon, which is highly transparent in the relevant infrared wavelength range; the use of silicon-germanium chips, among others, is also possible.

Due to the encapsulated structure of the radiation detector, the yield in the sawing process from the wafer(s) is improved, while handling and assembly are significantly simplified. The thermopile chips, cover chips, and optionally also the filter chips may be manufactured in different wafers, separated by sawing, and mounted on top of one another.

The connection between the thermopile chip and the cover chip is advantageously achieved via a bond connection, e.g., a seal glass bond, which forms a highly stable and vacuum-tight connection, while any mechanical tensions produced between the thermopile chip and the cover chip are negligibly small. The bond between the filter plate and the cover chip which is capable of transmitting the radiation and thus of fulfilling the function of the structure is formed by the defined adhesive layer.

The radiation detector according to the present invention may be inserted into a housing, preferably a premolded housing, by a standard assembly method. Manufacturing using a standard assembly method at a low cost is thus possible. Furthermore, no gluing process of filter plates into a metallic cover or adjustment to form a thermopile chip is needed. The direct chip-to-chip gluing of the filter plate onto the cover chip makes a simple gluing process and a simple adjustment of the filter plate possible.

According to the present invention, the filter plate may be selected to be very small, so that the manufacturing costs are kept low.

The encapsulated stack structure or layer structure according to the present invention makes it possible to glue the filter plate directly onto the cover chip using an adhesive layer, whereby advantageous integration of the radiation filter is possible without having to connect a filter to the seal glass bonds directly via the thermopile structure, which is not possible or is very expensive and would result in tension cracks in the filter layers due to the high temperatures for the seal glass process and the unsuitability of the filters for high temperatures.

The radiation detector according to an example embodiment of the present invention is encapsulated, i.e., the internal structure is in vacuum due to the hermetic seal glass bond; therefore, it may be inserted into a premolded housing, which may be designed as desired at a relatively low manufacturing cost. To passivate the wire bonds contacting the sensor chip, a passivating agent, for example, a gel, may be introduced, which does not affect the functionality of the encapsulated radiation detector.

Partial passivation of the wire bond may be achieved without contamination of the filter surface due to the enclosed chip structure and the great height between the bond area and the filter surface.

Furthermore, the testing complexity and testing costs may be kept low according to the present invention, because the function of the radiation detector may be tested in an open housing and repaired, for example, in the event of defective wire bonds.

BRIEF DESCRIPTION OF THE DRAWINGS

The present invention is further elucidated below with reference to the figures using some exemplary embodiments.

DETAILED DESCRIPTION OF EXAMPLE EMBODIMENTS

Figure 1:
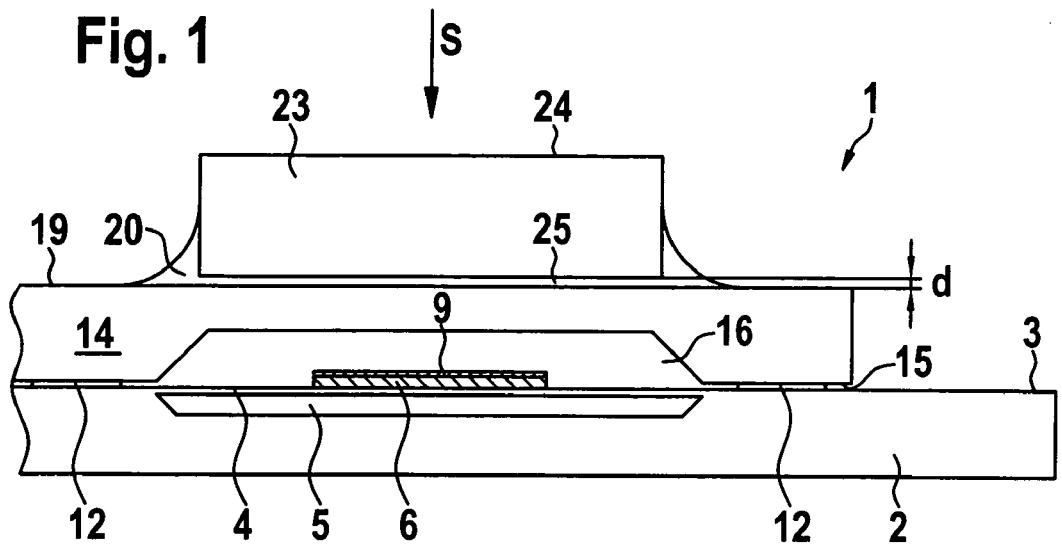
FIG. 1 shows a section through a radiation detector according to one example embodiment as a stack of three chips and a filter chip glued using an adhesive.

A radiation detector 1 has a lower silicon chip 2 having a diaphragm 4 formed on its top 3 and, underneath diaphragm 4, a first cavity 5 formed by underetching. A thermopile structure 6 having an absorber layer is formed on diaphragm 4, the thermopile structure and the absorber layer being conventional, and being manufactured, for example, from at least two contacted, conductive paths made of different materials, for example, metal and polysilicon (polycrystalline silicon). When infrared (IR) radiation strikes absorber layer 9, the latter heats up, which results in a thermal e.m.f. in thermopile structure 6 according to the Seebeck effect; this thermal e.m.f. may be read as an analog electrical signal.

On top 3 of lower silicon chip 2, a middle silicon chip having a second cavity 16 formed on its bottom 15 is attached as a cover chip 14 via a seal glass bond 12 which is formed around diaphragm 4 and made of a bonding agent, for example, a lead oxide. Cantilevered diaphragm 4 having thermopile structure 6 and absorber layer 9 is thus surrounded by the two cavities 5 and 16. The bonding process is performed under vacuum, so that vacuum is enclosed within the cavities.

An IR-transparent adhesive layer 20, on which a filter chip 23 made of silicon and used as a filter plate is attached, is applied to top 19 of cover chip 14. A filter structure 24 and/or 25 is formed, for example, as a dielectric mirror on the top and/or bottom of filter chip 23; this dielectric mirror is transparent only to IR radiation of a predefined wavelength range. IR radiation S incident from above passes into upper (second) cavity 16 and to absorber layer 9 through filter chip 23, IR-transparent adhesive layer 20, dependent on defined layer thickness d, and cover chip 14.

Figure 2:
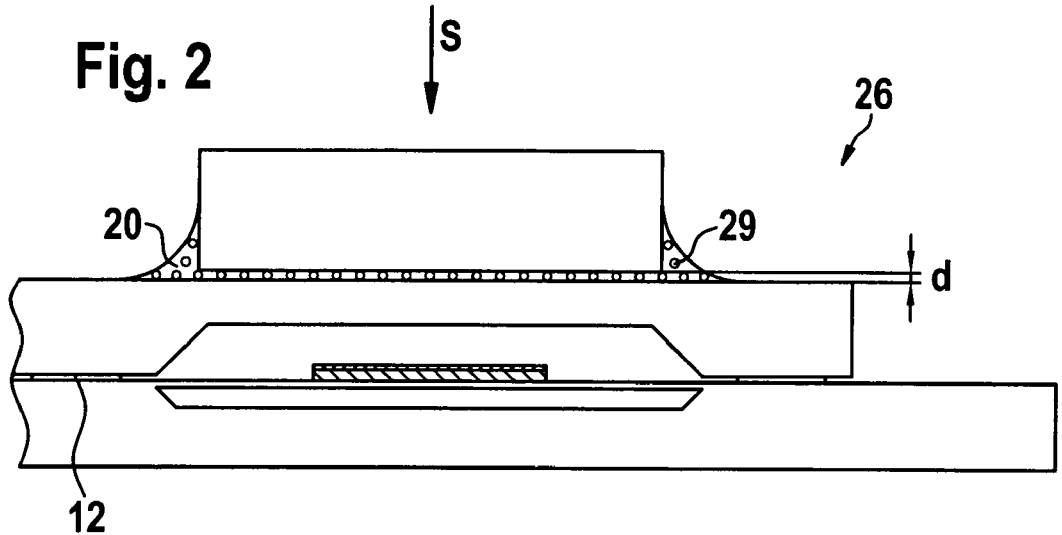
FIG. 2 shows a section through a radiation detector of an additional example embodiment and spacers embedded into the adhesive.

In radiation detector 26 of FIG. 2, in contrast to radiation detector 1 of FIG. 1, spacers 29 are also introduced into adhesive layer 20. The spacers may be glass beads, for example, or crystallites, for example, alumina granulates having a defined diameter. They are sufficiently thin in adhesive layer 20, so that when upper silicon chip 23 used as a filter plate is pressed on, spacers 29 become distributed so that only single spacers 29 are next to one another, but not on top of one another, between silicon chips 14 and 23. Adhesive thickness d thus corresponds to the diameter of spacers 29.

Figure 3:
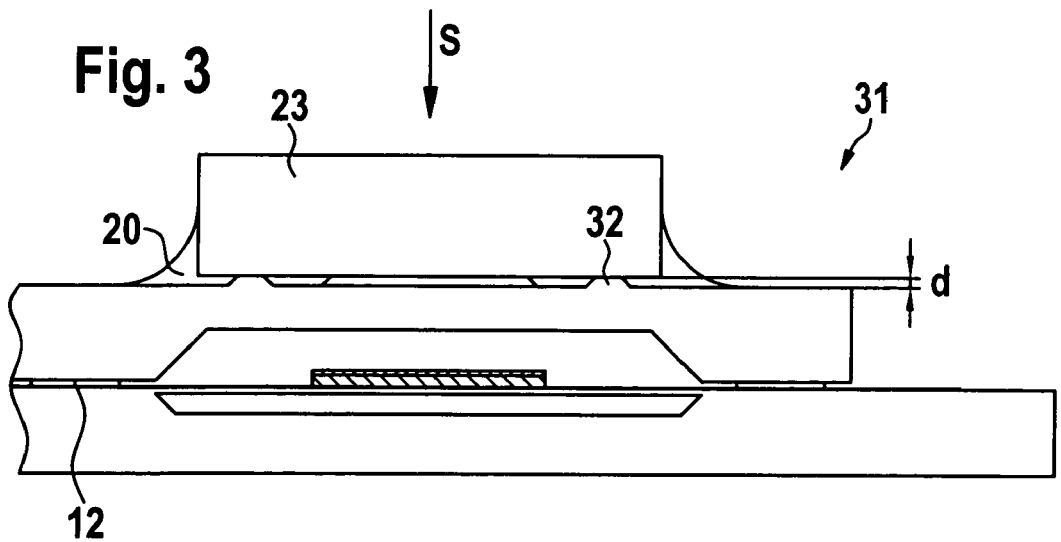
FIG. 3 shows a section through a radiation detector according to a further example embodiment and spacers formed in the cover.
Figure 4:
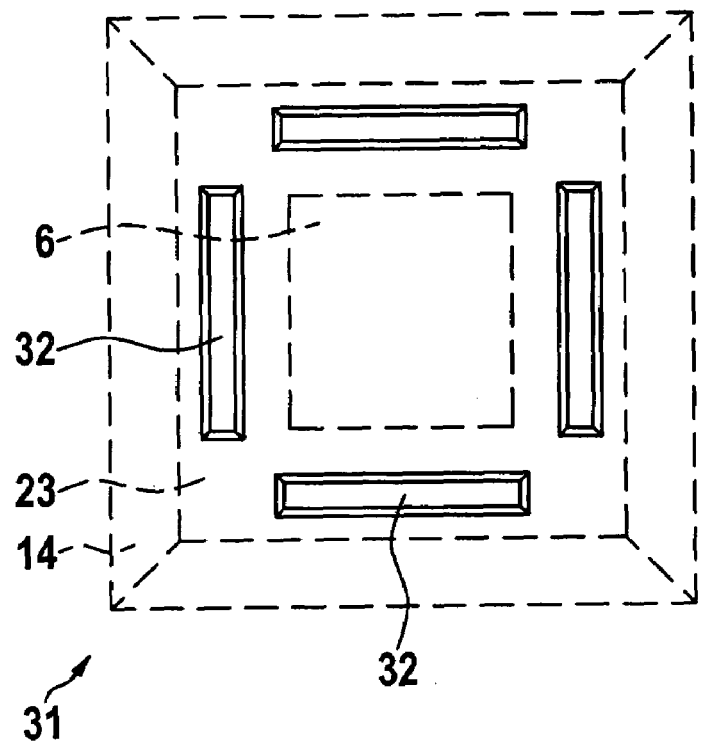
FIG. 4 shows a top view onto the cover chip of the radiation detector of FIG. 3.

In radiation detector 31 of FIG. 3, in contrast to radiation detector 1 of FIG. 1, spacers 32 are also patterned on top 19 of middle silicon chip 14; the height of these spacers determines thickness d of adhesive layer 20. Spacers 32 are formed laterally next to thermopile structure 6 and absorber 9, and thus do not affect incident IR radiation S, as is evident from the top view of FIG. 4, in particular, where the outlines of chips 23, 14 are shown in dashed lines.

The embodiments shown in FIGS. 1 through 4 represent example embodiments of the present invention, in which filter chip 23 is mountable in a defined and reproducible manner.

Figure 5:
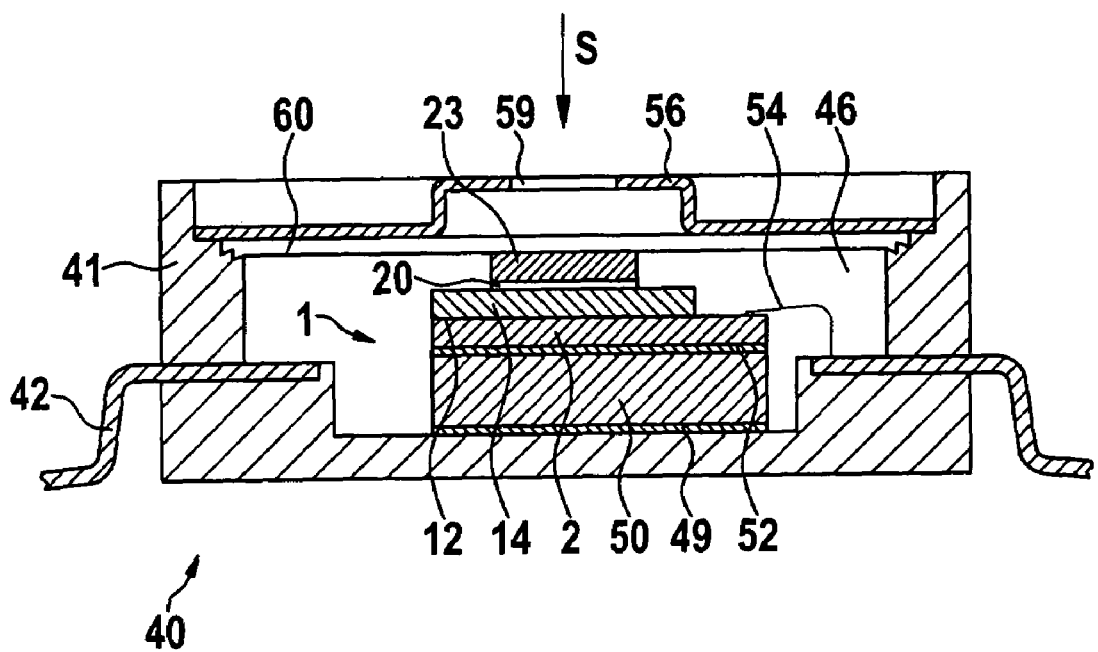
FIG. 5 shows a section through a sensor module having a premolded housing and a radiation detector according to an example embodiment of the present invention.

The embodiment of FIG. 5 includes a detector module 40 having a premolded housing 41 and a lead frame 42 extruded into premolded housing 41. On a bottom 45 of premolded housing 41, in inner space 46 of premolded housing 41, a base 50 made of silicon, for example, is attached via an adhesive layer 49, to which a radiation detector 1 or 26 or 31 of embodiments 1 through 3, having silicon chips 2, 14, and 23, is attached via an additional adhesive layer 52. Thermopile chip 2 is contacted with lead frame 42 via wire bonds 54, so that the thermal e.m.f. generated by the absorption of IR radiation S is readable electrically at thermopile structure 6. A cover 56 having a central opening 59 for passage of IR radiation S is placed onto and attached to premolded housing 41, for example, glued or soldered, or using hot caulking of the plastic edge, thus protecting inner space 46 and radiation detector 1. A gel, for example, is applied in inner space 46 as a passivating agent, which covers all wire bonds 54, but leaves the chip surface having filter structure 24 gel-free. One or more housing-side stop edges 60 may be used as stop edges for passivation, for example, a stop edge at the level of or underneath filter chip 23.

What is claimed is:

1. A radiation detector comprising:
   a thermopile chip including a diaphragm, a first cavity formed underneath the diaphragm, a thermopile structure formed on the diaphragm and an absorber layer applied to the thermopile structure;
   a cover chip, which has a second cavity on a bottom side and is attached to the thermopile chip in such a way that the diaphragm, the thermopile structure and the absorber layer is located between the first cavity and the second cavity; and
   a filter plate attached to the cover chip via an adhesive layer of a defined layer thickness, for transmitting infrared radiation of a defined wavelength range.

2. The radiation detector as recited in claim 1, wherein the filter plate is a chip having a filter structure.

3. The radiation detector as recited in claim 1, wherein the cover chip is attached to the thermopile chip via a vacuum-tight bond.

4. The radiation detector as recited in claim 3, wherein the bond is a seal glass bond.

5. The radiation detector as recited in claim 4, wherein the bond is made of lead oxide.

6. The radiation detector as recited in claim 1, further comprising:
at least one spacer provided between the cover chip and the filter plate to form a defined layer thickness of the adhesive layer.

7. The radiation detector as recited in claim 6, wherein the at least one spacer includes spacers contained in the adhesive layer.

8. The radiation detector as recited in claim 6, wherein the at least one spacer includes spacers patterned on a top of the cover chip in an area laterally around the thermopile structure.

9. A sensor module, comprising:
a premolded housing;
a lead frame extruded into the premolded housing;
a base mounted in an inner space of the premolded housing;
a radiation detector mounted on the base, the radiation detector including a thermopile chip including a diaphragm, a first cavity formed underneath the diaphragm, a thermopile structure formed on the diaphragm and an absorber layer applied to the thermopile structure, a cover chip, which has a second cavity on a bottom side and is attached to the thermopile chip in such a way that the diaphragm, the thermopile structure and the absorber layer is located between the first cavity and the second cavity, and a filter plate attached to the cover chip via an adhesive layer of a defined layer thickness, for transmitting infrared radiation of a defined wavelength range the thermopile chip of the radiation detector being contacted with the lead frame via wire bonds; and
a cover secured in or on the premolded housing, the cover having an opening for passage of infrared radiation onto the radiation detector.

10. The sensor module as recited in claim 9, wherein an inner space of the sensor module is filled with a passivating agent up to a stop edge.

11. The sensor module as recited in claim 10, wherein the passivating agent is a gel.

12. The sensor module as recited in claim 10, wherein a surface of the filter plate is free of passivating agent.

13. A method for manufacturing a radiation detector, comprising:
manufacturing from a first wafer a thermopile chip having a diaphragm, a first cavity etched underneath the diaphragm, a thermopile structure formed on the diaphragm and an absorber layer;
manufacturing, from a second wafer, a cover chips having a second cavity;
manufacturing a filter plate having a filter structure for passage of infrared radiation of a predefined wavelength range;
attaching the cover chip to the thermopile chip using a vacuum-tight bonding agent in such a way that the diaphragm, the thermopile structure, and the absorber layer are located between the first cavity and the second cavity; and
attaching the filter plate to the cover chip via an adhesive layer of a defined layer thickness.

14. The method as recited in claim 13, wherein the first cavity and the second cavity are formed by etching.

15. The method as recited in claim 14, wherein the filter plate is a filter chip having the filter structure on at least one of a top and a bottom.

16. The method as recited in claim 13, wherein spaces are provided between the cover chip and the filter plate, and wherein the adhesive layer includes an adhesive, the spacers have a diameter corresponding to the layer thickness, the adhesive layer is applied to the cover chip, and the filter plate is pressed onto the adhesive layer using a predefined press-on force in such a way that the spacers becomes distributed next to one another in the adhesive layer.

17. The method as recited in claim 13, wherein spacers are patterned on a top of the cover chip.

* * * * *